United States Patent [19]
Zamborelli et al.

[11] Patent Number: 5,646,542
[45] Date of Patent: Jul. 8, 1997

[54] PROBING ADAPTER FOR TESTING IC PACKAGES

[75] Inventors: Thomas J. Zamborelli, Colorado Springs, Colo.; Michael J. Steen, Wahpeton, N. Dak.

[73] Assignee: Hewlett-Packard Co., Palo Alto, Calif.

[21] Appl. No.: 587,344

[22] Filed: Jan. 16, 1996

Related U.S. Application Data

[63] Continuation of Ser. No. 265,853, Jun. 27, 1994, abandoned.

[51] Int. Cl.⁶ ................................. H01H 31/02
[52] U.S. Cl. ............................ 324/755; 324/765
[58] Field of Search ........................ 324/72.5, 750, 324/754, 755, 756, 765; 439/482, 66–70

[56] References Cited

U.S. PATENT DOCUMENTS

| | | | |
|---|---|---|---|
| 4,112,363 | 9/1978 | Morrison et al. | 324/758 |
| 4,996,476 | 2/1991 | Balyasny | 439/70 |
| 5,033,977 | 7/1991 | Ignasiak | 439/482 |
| 5,049,813 | 9/1991 | Loan et al. | |
| 5,221,209 | 6/1993 | D'Amico | 439/71 |
| 5,323,106 | 6/1994 | Saegusa | 324/758 |
| 5,347,215 | 9/1994 | Armstrong et al. | 324/158.1 |

*Primary Examiner*—Vinh P. Nguyen
*Attorney, Agent, or Firm*—Patrick J. Murphy

[57] ABSTRACT

A probe adapter providing the capability to test integrated circuit (IC) packages is presented. The probe adapter comprises a mechanical assembly and a probe wire assembly. The mechanical assembly houses the probe wire assembly and facilitates attachment of the probe adapter to the IC under test. The mechanical assembly also ensures correct alignment of the probe wire assembly with the leads of the IC package. The mechanical assembly comprises an alignment member, a guide, a frame and an adapter printed circuit board (PCB). The probe wire assembly comprises a plurality of probe wires, the plurality of probe wires being placed into a plurality of apertures along the perimeter of the guide. One end of the probe wire is placed into electrical contact with a IC package lead, the other end being electrically attached to a tester via the adapter PCB.

2 Claims, 11 Drawing Sheets

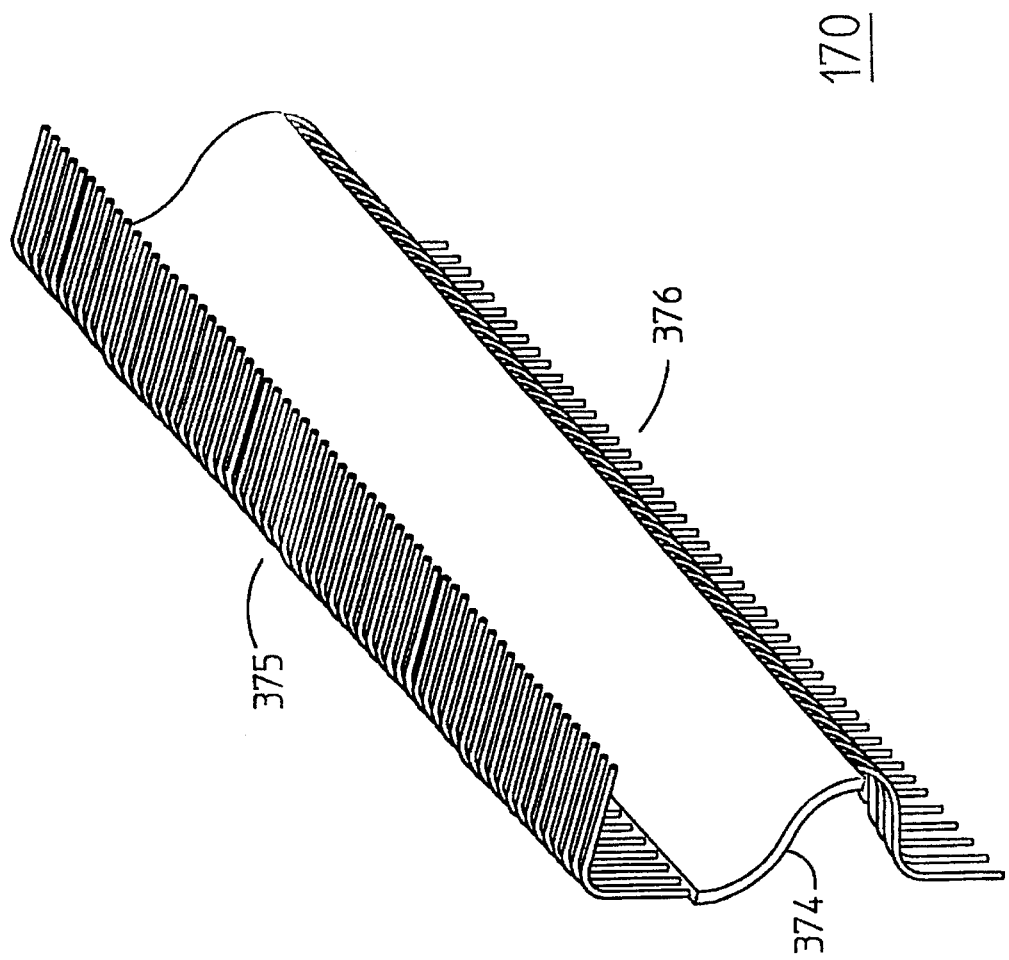

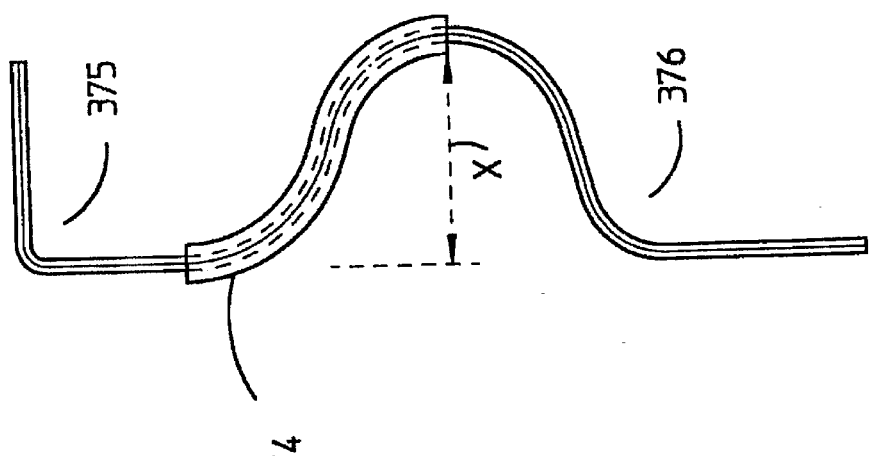

PROBING ADAPTER FOR TESTING IC PACKAGES

CROSS REFERENCE TO RELATED APPLICATION

This is a continuation of application Ser. No. 08/265,853 filed on Jun. 27, 1994, now abandoned.

FIELD OF THE INVENTION

The present invention relates generally to electronic test equipment and more particularly to a test probe assembly for electrically connecting the leads of an integrated circuit package to an electronic measurement device.

BACKGROUND OF THE INVENTION

Integrated circuit (IC) packages are typically comprised of an insulated housing with a plurality of lead connectors extending outwardly from the housing. One common IC package is the dual in-line package (DIP) in which electrical leads are brought out along two sides of the housing. Another common IC package is the quad flat package (QFP) in which the leads are brought out along four sides. The leads may be bent to a number of configurations for surface mounting on printed circuit boards; "gull-wing" is one of the more common bent lead configurations.

Electronic test equipment (e.g., oscilloscope, logic analyzer, emulator) is used to analyze various electrical aspects of the IC including voltage and current waveforms. Typically, a loaded printed circuit board is crowded with various electrical components, including multiple IC packages. Due to the close spacing of components on the board (i.e., high "board density"), as well as the small size and pitch of each IC package lead, it is often difficult to manipulate each lead with a test probe to electrically connect each lead to the test equipment.

One common method for circuit testing involves connecting individual test probes to individuals IC leads. Another method involves a "test clip," which commonly includes a spring-tensioned lead portion which "clips" onto an IC package to hold the circuit testing device leads firmly against the IC package leads. Typically, the circuit testing device leads in a test clip are not insulated from one another so that extreme care must be taken to prevent misalignment which can result in a shorted electrical connection between the circuit testing device leads. Another problem with test clips is that they tend to have a much larger footprint than the IC package to be tested; this increases the chance that the test clip will interfere with adjacent components during testing. One problem that is common to both individual test probes and test clips is that the IC package leads are contacted either on the "foot" of the leads, where the leads are soldered to a printed circuit board, or on the angled portion that ramps down to the foot. These two areas on the package leads are either poorly defined and controlled or susceptible to change during processing and handling.

SUMMARY OF THE INVENTION

The present invention provides a probe adapter for testing integrated circuit packages. The probe adapter comprises (1) a mechanical assembly and (2) a probe wire assembly. The mechanical assembly essentially houses the probe wire assembly. The probe wire assembly is placed into contact near the knee of the electrical leads of the IC package at one end. The other end of the probe wire assembly is electrically connected to test equipment, such as a logic analyzer, to facilitate various electrical measurements on the IC. The mechanical assembly ensures correct alignment of the probe wire assembly with the leads of the IC package.

The mechanical assembly comprises an alignment member, a guide, a frame, and an adapter printed circuit board (PCB). Two embodiments of the alignment member are presented. A first embodiment alignment member has at least one major threaded post to facilitate clamping of the probe adapter to the IC package. This first alignment member is attached to the top side of the IC package using a locator. A second embodiment alignment member is positioned around the periphery of the IC package. This second alignment member has corner guides and guide teeth stubs to ensure correct alignment of the probe adapter.

The probe wire assembly comprises a plurality of probe wires, each wire being placed through the guide of the mechanical assembly at one end and being electrically connected to the adapter PCB at the opposite end.

BRIEF DESCRIPTION OF THE DRAWINGS

FIG. 3a shows a probe wire assembly according to the present invention.

FIG. 3b shows a probe wire.

DETAILED DESCRIPTION OF THE PREFERRED EMBODIMENT

Figure 1A:
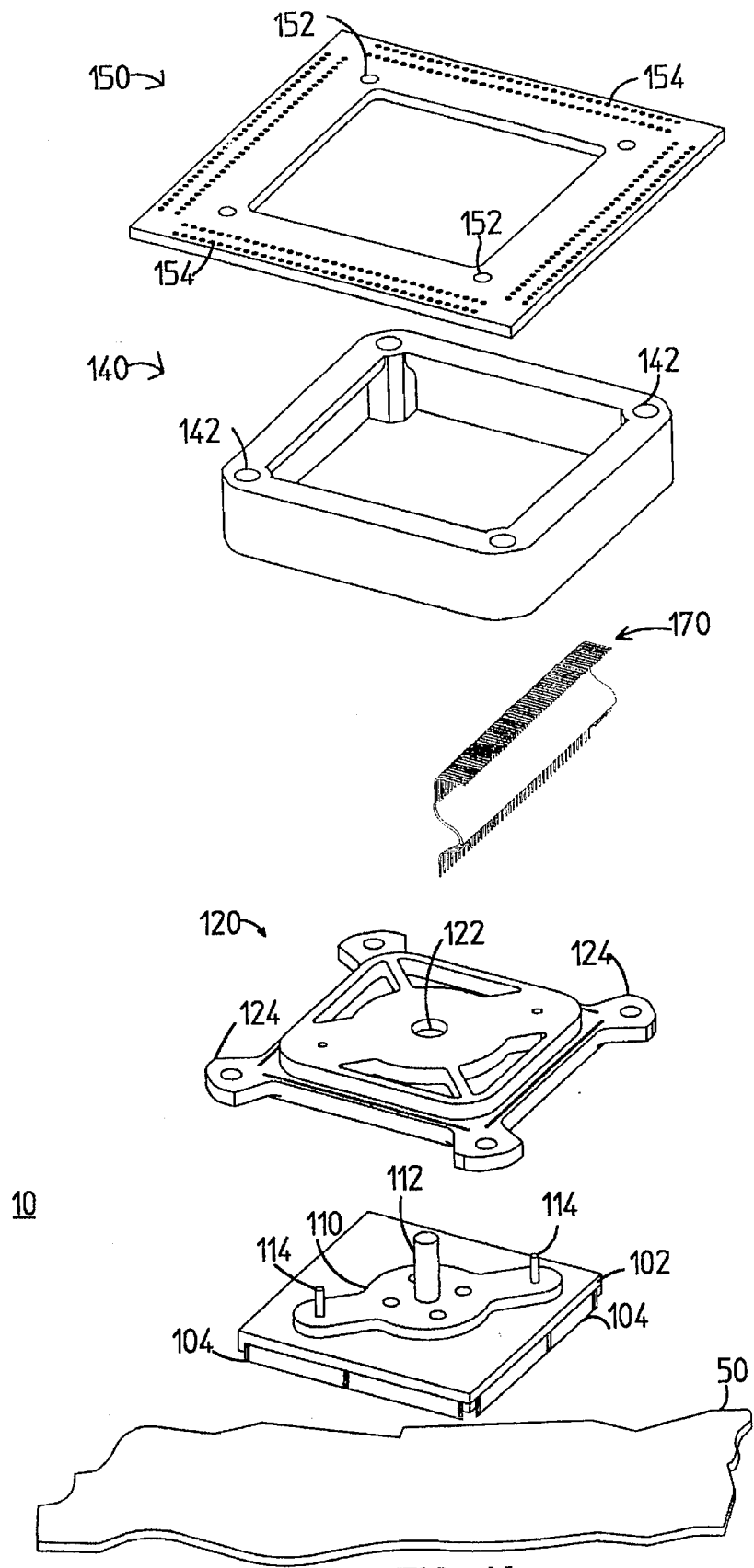
FIG. 1a shows an exploded view of the probe assembly according to the present invention.

FIG. 1a shows an exploded view of a preferred embodiment of the probe adapter 10 according to the present invention. Generally, the probe adapter 10 comprises a mechanical assembly and a probe wire assembly. This view provides an illustration of the adapter 10 to give the reader an understanding of the mechanical interrelationships among the probe adapter 10 elements. A portion of a printed circuit board (PCB) 50, as well as an exemplary integrated circuit (IC) package 100, are also illustrated. The IC package 100, which is rectangular in shape, comprises integrated circuits and circuit elements (not shown) encased within an insulated housing 102. Electrical leads 104 extend outwardly from the housing 102. The leads 104 can be made of beryllium copper and gold- or tin-plated, for example. In a preferred embodiment, the IC package 100 is a quad flat pack (QFP) which is rectangular, each side being approximately 32 millimeters in length. Other sizes are available, depending upon the QFP type. The QFP may be any one of generally well-known QFPs, including a ceramic QFP, a metal and ceramic QFP, a plastic QFP or a fine pitch QFP. In a preferred embodiment, the QFP has 240 electrical leads, 60 leads on a side. Other IC sizes, shapes and package configurations (e.g., dual in-line packages), may be used without departing from the scope of the present invention. The IC package 100 may be attached to the PCB 50 using conventional soldering techniques.

The mechanical assembly of the probe adapter 10 comprises several elements, including an alignment member 110 which is attached to the top-side of the IC package 100 with an adhesive. The alignment member has at least one major post 112 which extends perpendicularly from the flat body of the alignment member 110. This major post 112 has external threads to accept a threaded nut which clamps the probe adapter 10 to the IC package (via the alignment member 110). Several minor posts (e.g., item 114) may also be present. The alignment member is placed upon the IC package 100 using a locator 116 (see FIG. 1b) which is formed of plastic and has similar perimeter measurements to the IC package 100. The locator 116 facilitates placement of the alignment member 110 on the IC package 100. Once the alignment member 110 is affixed to the IC package 100, the locator 116 may be set aside.

A guide 120, preferably formed of plastic, is placed atop the IC package 100. The guide 120 has at least one aperture 122 which corresponds to the dimensions of the major post 112 of the alignment member 110. The guide 120 also has connection stubs 124, each comprising an aperture to accept a first connector (not shown), such as a screw or a pin. Fine pitched aperture sleeves (see FIG. 6) are positioned along the outside perimeter of the guide 120. These sleeves have a diameter which is slightly larger than that of the probe wires in the probe wire assembly 170 (see also FIGS. 3a and 3b) so as to facilitate vertical, independent movement of the probe wires when the adapter 10 is constructed. Only one probe wire assembly 170 is illustrated. In a preferred embodiment, 4 probe wire assemblies 170 would be placed along and within the perimeter of the probe adapter 10. An alternative embodiment in which 2 probe wire assemblies are positioned at opposite sides of the probe adapter 10 would facilitate testing of dual in-line IC packages.

A frame 140 is disposed above the guide 120. The frame 140, preferably formed of plastic, comprises bores 142 which may be threaded to accept first and second connectors from above and below. The frame 140 is the anchor of the probe adapter 10; it provides the means (i.e., the bores 142) for constructing the adapter 10 and also supplies mechanical support to the probe wire assembly 170 which it substantially encases. An alternative embodiment frame is adhesively attached to the guide 120, leaving the bores 142 free to accept screws or the like which pass through the probe adapter 10 and secure it to the PCB 50 as discussed below with respect to FIG. 7.

An adapter PCB 150 is attached to the frame 140 via second connectors (not shown). The adapter PCB 150 comprises apertures 152 to accept the second connector and connector plug holes 154 so that the adapter can be hooked up to electronic test equipment such as an oscilloscope or logic analyzer via flexible cable for example. An alternative embodiment adapter PCB is adhesively attached to the frame 140, leaving the apertures 152 free to accept screws or the like which pass through the probe adapter 10 and secure it to the PCB 50 as discussed below with respect to FIG. 7.

Figure 1B:
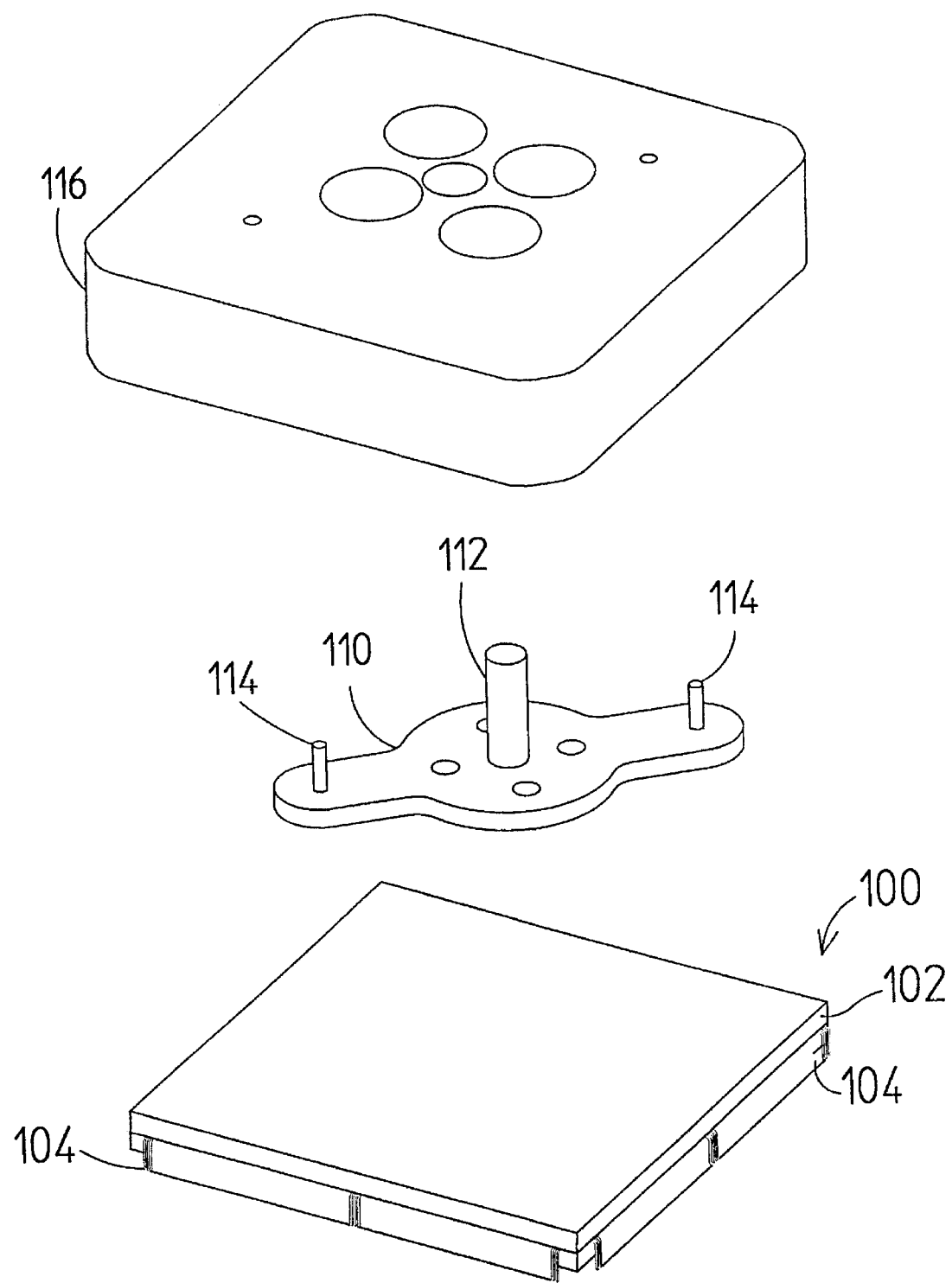
FIG. 1b shows a locator according to the present invention.

FIG. 1b shows a locator 116. The locator 116 is not part of the assembled probe adapter. Rather, it is a tool which facilitates placement of the alignment member 110 upon the IC package 100. The locator 116, which is preferably formed of plastic, has at least three apertures which correspond to the major 112 and minor posts 114 of the alignment member 110. The perimeter of the locator 116 is slightly larger than the perimeter of the IC package 100 so that, with the alignment member 110 placed within the locator 116, one is able to centrally position the alignment member 110 on the top-side of the IC package 100.

Figure 2:
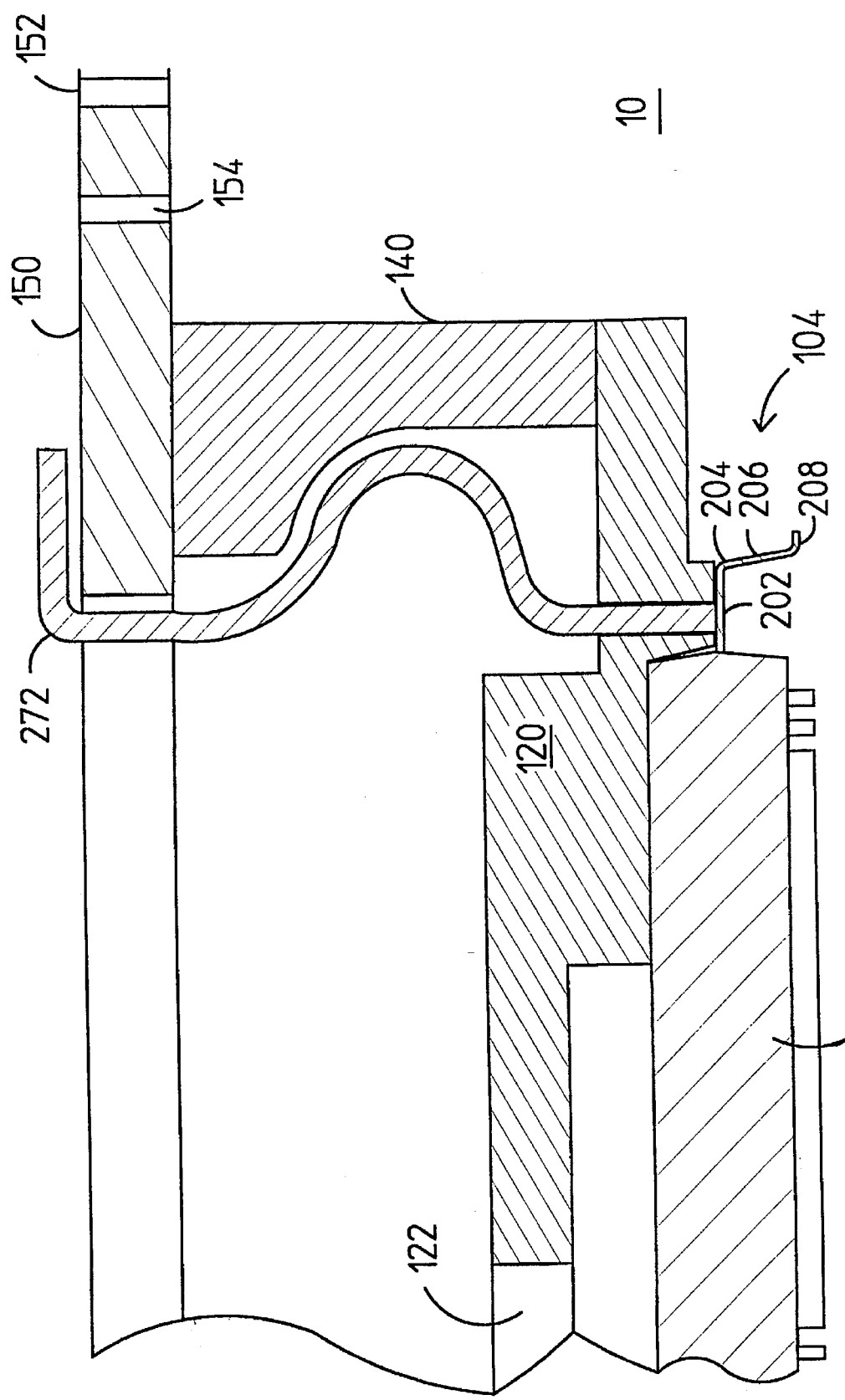
FIG. 2 shows an exposed side view of the probe assembly.

FIG. 2 shows an exposed side view of the probe adapter 10. As illustrated, the footprint of the probe adapter 10 is only slightly larger than the IC package being tested. A probe wire 272 is attached to the adapter PCB 150 via conventional soldering techniques and is positioned along the inner surface of the frame 140 when the probe adapter 10 is assembled. The probe wire 272 is configured to provide compliance when it comes in contact with the electrical lead 104 as will be discussed more fully below with respect to FIGS. 3a and 3b. Connection means are provided to connect the probe adapter via the connector plug holes 154 to test equipment.

As shown in FIG. 2, the lead 104 is configured in the "gull-wing" shape. The gull-wing lead 104 comprises: a first section 202 which extends horizontally outward from the housing 102 of the IC package; a second section 204 where the lead 104 angles downwardly (this section is commonly called the "knee"); a third section 206 which is disposed below the second section 204; and a fourth section 208 where the lead levels outwardly (this section is commonly called the "foot"). In a preferred embodiment, the probe wire 272 contacts the first section 202 of the lead 104. In alternative embodiments (not shown), the probe wire 272 may contact the knee 204, the third section 206 or the foot 208 without departing from the scope of the present invention. One of the advantages of the probe adapter 10 is that it provides a reliable contact with the leads 104 of the IC package 100 by engaging the leads 104 in an area where their location is best controlled and least likely to be affected by handling or assembly, e.g., the first section 202 or third section 206.

FIGS. 3a and 3b show the probe wire and wire assembly according to the present invention. The probe wire assembly is formed from a ribbon-style cable available from W.L. Gore and Associates, 750 Otts Chapel Road, P.O. Box 8038, Newark, Del. 19714 (Gore Part No. TLSN1998). Referring to FIG. 3a, the plastic sheath is stripped from the top and the bottom of the wire cable thus exposing the individual probe wires. In a preferred embodiment, the probe wire assembly 170 comprises 60 individual probe wires. The top portion 375 is bent 90° to facilitate attachment to the adapter PCB (item 150 in FIGS. 1 and 2). A section of the plastic sheath, or jacket, is retained for the middle portion 374 to provide insulation between the individual probe wires and overall strength to the probe wire assembly 170. The bottom portion 376, in conjunction with the middle portion 374, is bent into roughly a U-shape to provide vertical resilience of the probe wires when they come into contact with the package leads. This compliance of the probe wires facilitates connection to the IC package leads (item 104 in FIG. 1) to account for variations among IC packages and processing assembly. Referring now to FIG. 3b, the U-shaped bend of the probe wire 272 is better illustrated. The distance, x, from the vertical axis of the probe wire 272 to the apex of the bend is approximately 4 millimeters (mm) in a preferred embodiment. The length of the exposed wire of the top portion 375 is preferably 6.2 mm.; the length of the jacket sheath 374 is preferably 6.6 mm.; the length of the exposed wire of the bottom portion 376 is preferably 9.4 mm. Other lengths can be used without departing from the scope of the present invention. For example, the length of the top portion 375 could be 7 mm.; the jacket sheath could be 5 mm.; and the bottom portion 376 could be 10 mm.

Figure 4:
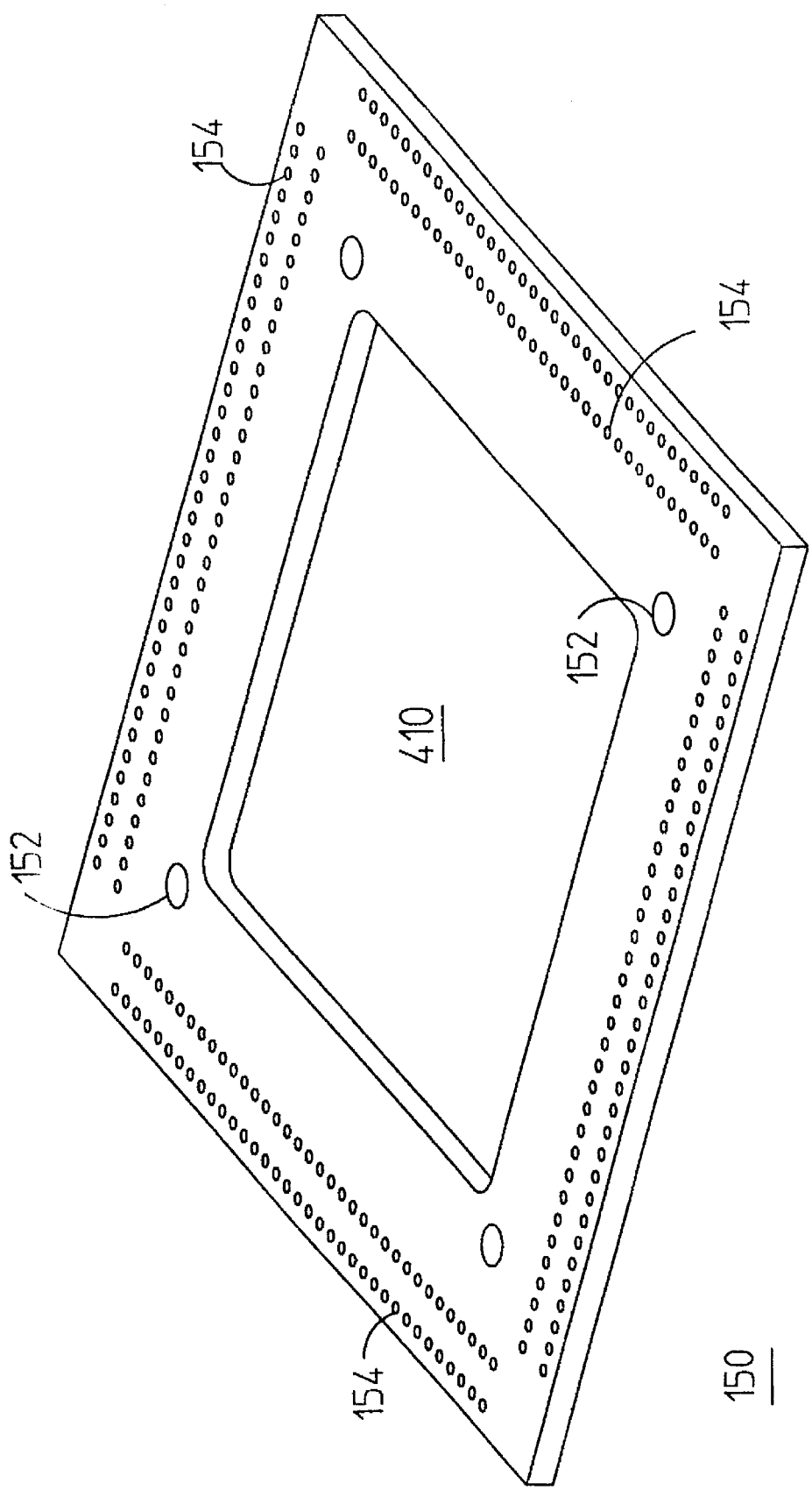
FIG. 4 shows an enlarged view of the PCB adapter.

FIG. 4 shows an enlarged view of the PCB adapter 150. An aperture 410 has a perimeter that is slightly larger than the IC package (item 100 in FIG. 1a) that is under test. Apertures 152 are large enough to accept a second connector for attachment during final assembly of the probe adapter. In a preferred embodiment, the second connectors are #2-56 screws. Connector plug holes 154 are located along the periphery of the PCB adapter 150. These plug holes 154 can accept either fine pitch sockets or headers mounted onto the PCB adapter 150. Each of the plug holes 154 are electrically coupled to connector traces (not shown) which connect the individual probe wires of the probe wire assembly to the sockets. The sockets can then be attached to a flexible wire cable for connection to test equipment. In an alternative embodiment, any of a number of the plug holes 154 may be grounded so as to ground an IC package lead during testing.

Figure 5:
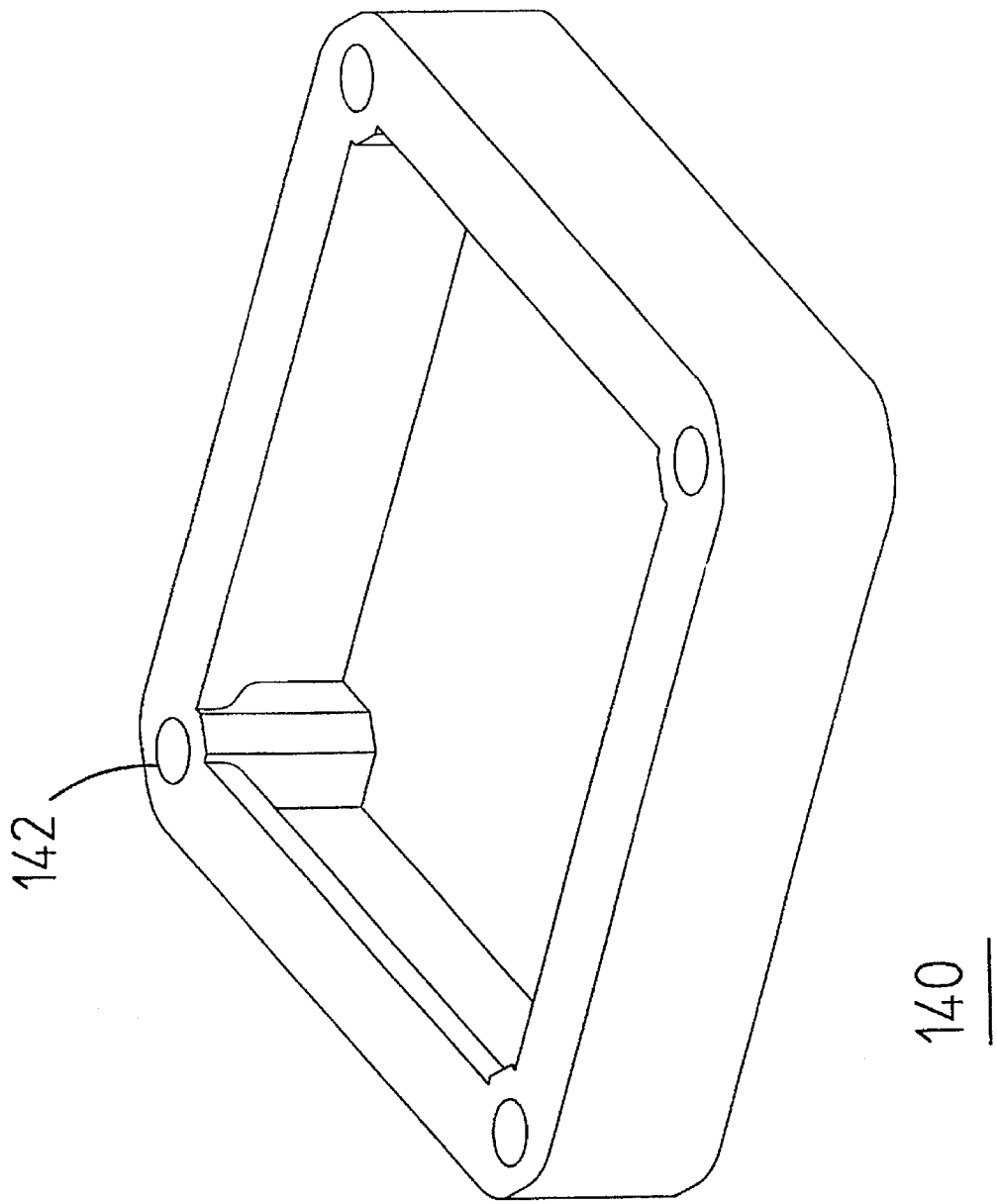
FIG. 5 shows an enlarged view of the frame.

FIG. 5 shows an enlarged view of the frame 140. The inner perimeter of the frame 140 is curved to compliment the U-shaped curve of the probe wire assembly (item 170 in FIG. 3a) and provide additional mechanical support to the probe wires (item 272 in FIG. 3b).

Figure 6:
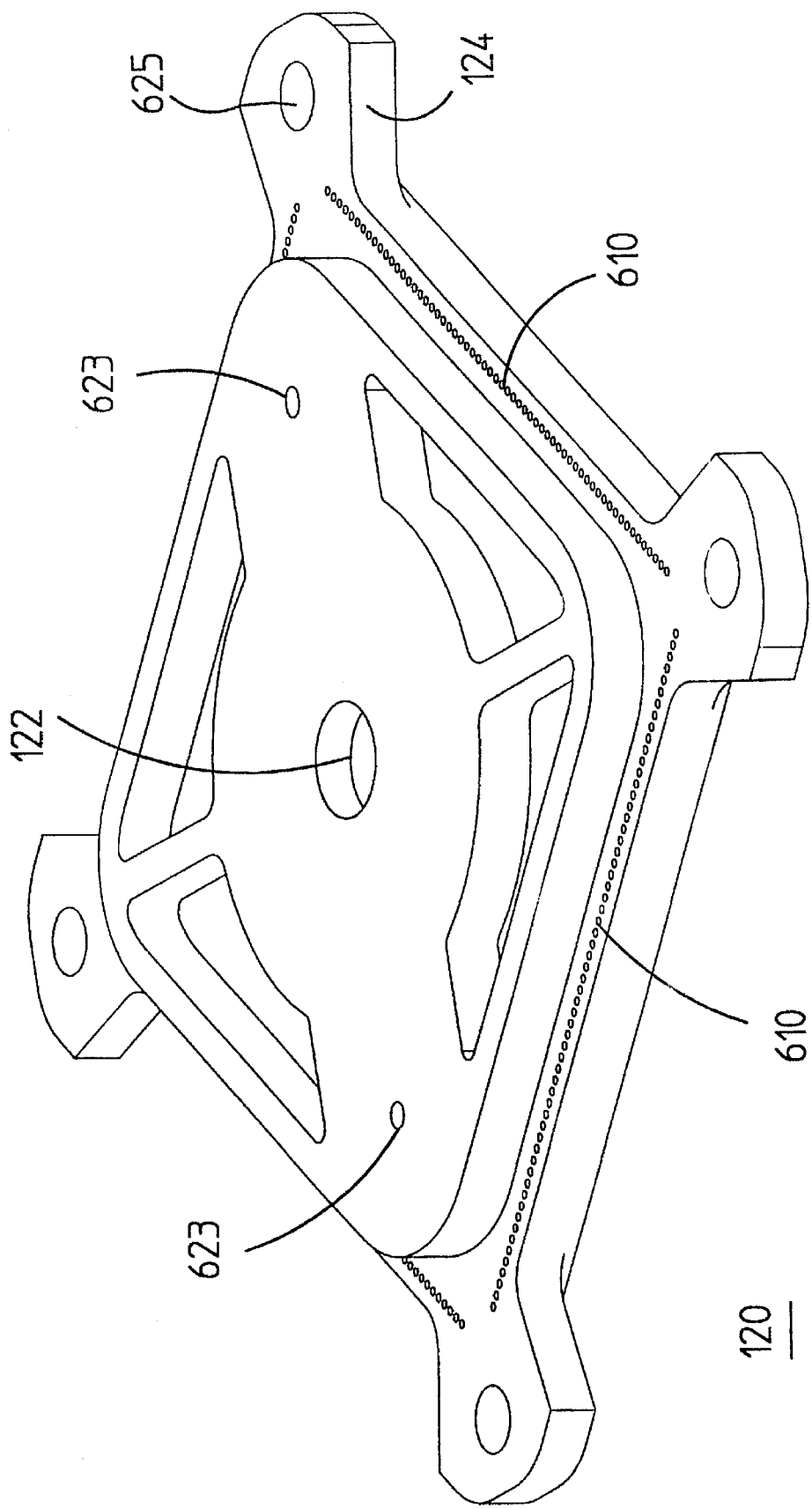
FIG. 6 shows an enlarged view of the guide.

FIG. 6 shows an enlarged view of the guide 120. Aperture 122 is large enough to accept the main post of the alignment member (items 112 and 110 respectively in FIG. 1a). Apertures 623 have approximately the same diameter as the minor posts (item 114 in FIG. 1a). Connection stubs 124 extend outwardly from the four corners of the guide 120 to facilitate probe adapter construction. Each connection stub 124 has an aperture 625 large enough to accept a first connector, which in a preferred embodiment is a #2-56 screw. Fine pitched aperture sleeves 610 are placed along the periphery of the guide 120 to accept the individual probe wires from the probe wire assembly (see FIGS. 3a and 3b). In a preferred embodiment there are 60 aperture sleeves per side.

Figure 7A:
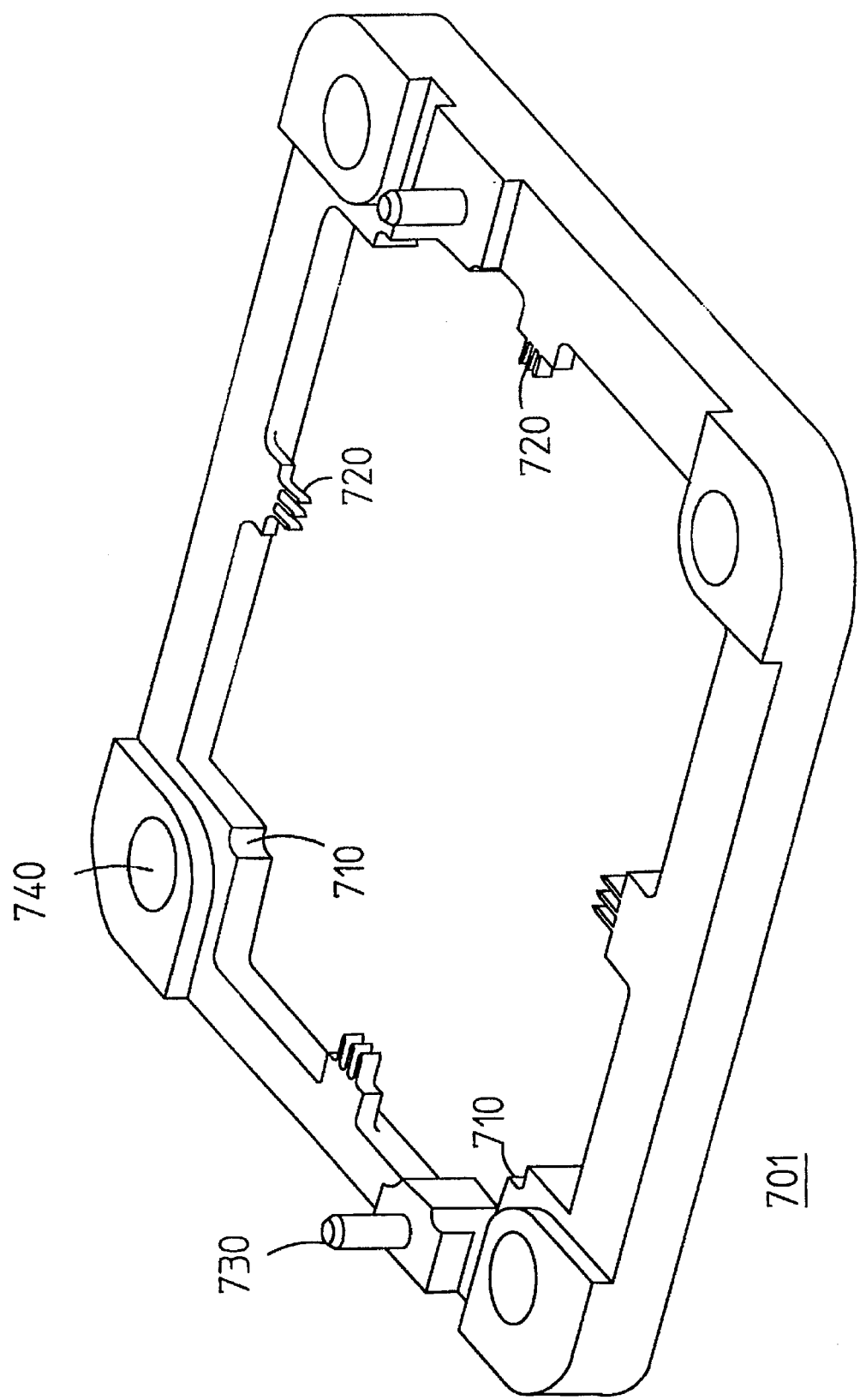
FIG. 7a shows an alternative embodiment of the alignment member.
Figure 7B:
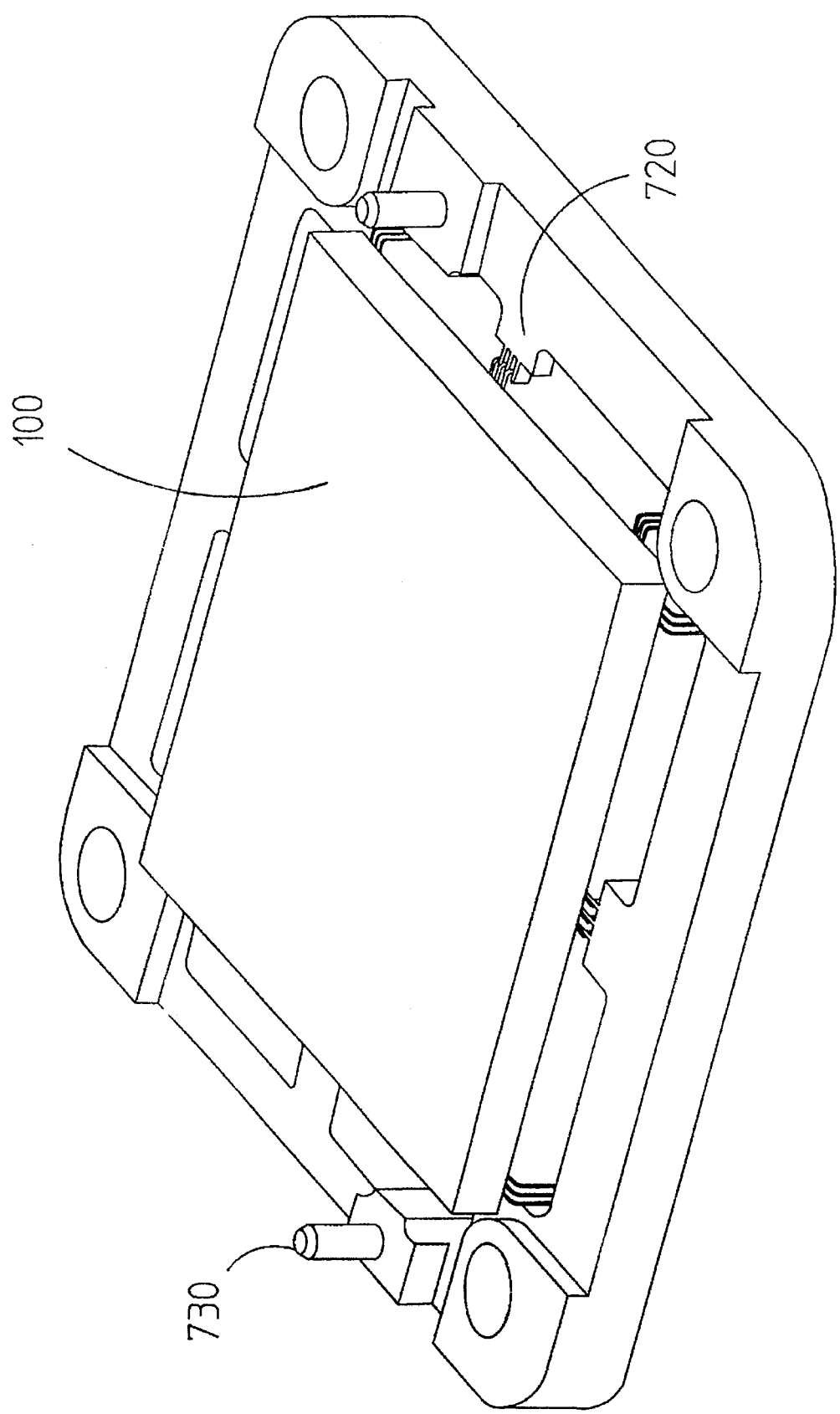
FIG. 7b shows the alternative embodiment of the alignment member connected to an IC package.

FIG. 7a shows an alternative embodiment of the alignment member. Instead of using the alignment member (item 110 in FIG. 1a) which needs to be affixed to the top of the IC package, alignment member 701 is rectangular in shape and is positioned around the periphery of the IC package. In a preferred embodiment, alignment member 701 is formed of plastic. Corner guides 710 and guide teeth stubs 720 facilitate placement of the alignment member 701 around the IC package 100 as shown in FIG. 7b. In a preferred embodiment, there are four corner guides 710 and four guide teeth stubs 720. Two corner guides 710, positioned diagonally within the rectangular frame of the alignment member 701, and two guide teeth stubs, positioned along opposite sides of the alignment member 701, could be used as well.

The corner guides 710 are molded to fit the four corners of the IC package. The guide teeth stubs 720 are molded to fit between leads of the IC package and can be placed anywhere along each of the four sides of the alignment member 701. In a preferred embodiment, there are three teeth per guide teeth stub 720 and the stubs 720 are placed in the center of each side. The corner guides 710 extend to the bottom of the alignment member 701 such that they engage the corner legs (item 104 in FIG. 1a) of the IC package first, essentially performing a preliminary alignment with the IC package. With this accomplished, the guide teeth stubs 720 can then only fit into the spaces between the proper IC package leads as the alignment member 701 moves further down onto the IC package to ensure absolutely correct alignment.

Apertures 740 are placed in the four corners of the alignment member 701. These apertures 740 are large enough to allow a screw or the like to pass through the probe adapter (item 10 in FIG. 1a) and alignment member 701 to the PCB (item 50 in FIG. 1a); this firmly secures the probe adapter to the PCB. An alternative method of attaching the alignment member 701 is to use an adhesive on the bottom side of the alignment member 701 to attach it to the PCB. Apertures 740 are then threaded to accept a screw or the like through the probe adapter to firmly secure the probe adapter to the PCB. Alignment posts 730 facilitate assembly of the probe adapter (item 10 in FIG. 1a). In a preferred embodiment, there are two alignment posts 730 that are substantially diagonal from each other.

Figure 8:
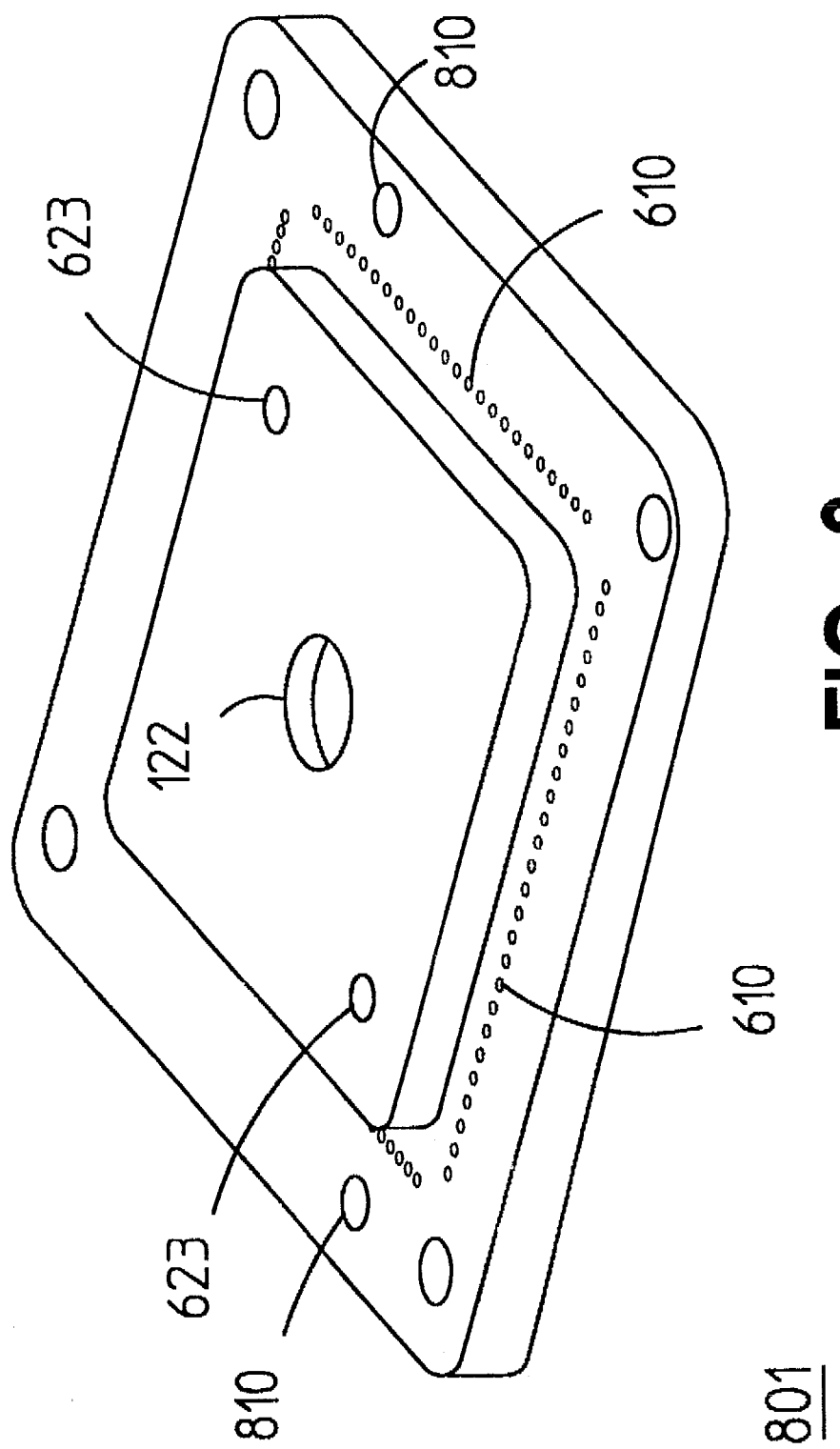
FIG. 8 shows an alternative embodiment of the guide.

FIG. 8 shows an alternative embodiment of the guide that can be used with either type of alignment member (item 120 in FIG. 6 or item 701 in FIG. 7). Connector plate 801 has the same center apertures found in item 120 in FIG. 6. That is, aperture 122 is large enough to accept the main post of the alignment member (items 112 and 110 respectively in FIG. 1a); and apertures 623 have approximately the same diameter as the minor posts (item 114 in FIG. 1a). Additionally, connector plate 801 has apertures 810 which correspond to the alignment posts (item 730) of alignment member 701 in FIG. 7.

While the present invention has been illustrated and described in connection with the preferred embodiment, it is not to be limited to the particular structure shown. For example, a larger length of ribbon cable could be used for the probe wire assembly (item 170 in FIG. 1), facilitating direct connection to a logic analyzer or oscilloscope.

What is claimed is:

1. A probe adapter for contacting leads of an integrated circuit package, the integrated circuit package having a top side and being mounted to a circuit board, the probe adapter comprising:

a probe wire assembly having a plurality of probe wires, the plurality of probe wires electrically connected to a first section of the leads of the integrated circuit package, the first section extending horizontally outward from the integrated circuit package, the probe wire assembly is formed from a ribbon-style cable having a plastic sheath, the plastic sheath prodding insolation between individual probe wires; and a mechanical assembly, which retains the probe wire assembly, the mechanical assembly aligns the probe wire assembly with the integrated circuit package, maintaining proper electrical connection between the leads and the plurality of probe wires, the mechanical assembly comprises: (i) an alignment member coupled to the integrated circuit package; (ii) a guide, coupled to the alignment member, the guide having a perimeter and a plurality of apertures positioned along the perimeter for retaining the plurality of probe wires; (iii) a frame, connected to the guide, for substantially encasing the probe wire assembly; and (iv) an adapter printed circuit board; connected to the frame, the adapter printed circuit board is electrically connected to the plurality of probe wires, wherein the alignment member comprises:

a rectangular frame;

at least two corner guides, positioned diagonally within the rectangular frame;

at least two guide teeth stubs, positioned along opposite sides within the rectangular frame, each of said at least two guide teeth stubs having teeth extending inwardly from the rectangular frame; and at least two apertures, positioned diagonally along the rectangular frame, said at least two apertures accept screws to facilitate mounting the probe adapter to the circuit board.

2. A probe adapter for contacting leads of an integrated circuit package, the integrated circuit package being mounted to a circuit board, the adapter comprising:

a probe wire assembly having a plurality of probe wires, the plurality of probe wires electrically connected to a first section of the leads of the integrated circuit package, the first section extending horizontally outward from the integrated circuit package, the probe wire assembly is formed from a ribbon-style cable having a plastic sheath, the plastic sheath providing insulation between individual probe wires; and a mechanical assembly, which retains the probe wire assembly, the mechanical assembly aligns the probe wire assembly with the integrated circuit package, maintaining proper electrical connection between the leads and the plurality of probe wires, the mechanical assembly further comprising:

an alignment member connected to the top side of the integrated circuit package;

a guide, coupled to the alignment member, the guide having a plurality of apertures along the perimeter for retaining the plurality of probe wires;

a frame, connected to the guide, for substantially encasing, the probe wire assembly; and an adapter printed circuit board, connected in the frame, the adapter printed circuit board is electrically connected to the plurality of probe wires, wherein the alignment member comprises:

a rectangular frame;

at least two corner guides, positioned diagonally within the rectangular frame;

at least two guide teeth stubs, positioned along opposite sides within the rectangular frame, each of said at least two guide teeth stubs having teeth extending inwardly from the rectangular frame; and at least two apertures, positioned diagonally along the rectangular frame, said at least two apertures accept screws to facilitate mounting the probe adapter to the circuit board.

* * * * *